United States Patent [19]

Kim et al.

[11] 4,429,011
[45] Jan. 31, 1984

[54] COMPOSITE CONDUCTIVE STRUCTURES AND METHOD OF MAKING SAME

[75] Inventors: Manjin J. Kim; Tat-Sing P. Chow, both of Schenectady, N.Y.

[73] Assignee: General Electric Company, Schenectady, N.Y.

[21] Appl. No.: 362,682

[22] Filed: Mar. 29, 1982

[51] Int. Cl.$^3$ .................. B05D 5/12; H01L 21/306
[52] U.S. Cl. ........................... 428/450; 148/6.31; 148/33.5; 427/96
[58] Field of Search .............. 428/450; 148/6.31, 33.5; 427/96; 423/409

[56] References Cited

U.S. PATENT DOCUMENTS

| | | | |
|---|---|---|---|
| 3,200,015 | 8/1965 | Kuntz | 148/6.3 |
| 3,337,375 | 8/1967 | Casey et al. | 148/33.5 |
| 3,619,233 | 11/1971 | Hipp et al. | 428/250 X |
| 4,333,964 | 6/1982 | Ghezzo | 427/96 X |
| 4,333,965 | 6/1982 | Chow et al. | 427/96 X |

OTHER PUBLICATIONS

S. P. Ghosh, Nitrides of Molybdenum, Journal Indian Chem. Soc., vol. 29, No. 7, 1952.
H. Okabayashi et al., A Mo-Nitride/Mo Gate MOS Structure, Extended Abstracts of the Electrochemical Soc. Inc.-May 10-15, 1981, pp. 753-755.

*Primary Examiner*—George F. Lesmes
*Assistant Examiner*—Nancy A. B. Swisher
*Attorney, Agent, or Firm*—Julius J. Zaskalicky; James C. Davis, Jr.; Marvin Snyder

[57] ABSTRACT

A composite conductive structure which includes an insulating substrate on which is provided a conductor of molybdenum covered by a layer of molybdenum nitride and a method of making the structure are described. The method includes heating the conductor of molybdenum in an atmosphere of ammonia in the range from about 400° C. to 850° C. for a time to cause the atmosphere to react with the conductor to convert a portion of the conductor into molybdenum nitride.

24 Claims, 5 Drawing Figures

COMPOSITE CONDUCTIVE STRUCTURES AND METHOD OF MAKING SAME

The present invention relates in general to composite conductive structures and in particular to composite conductive structures in integrated circuit devices and methods of making same.

As the density of circuit elements in integrated circuits and the speed of operation thereof is increased, the resistance of the electrodes and the interconnection lines must be decreased. Polycrystalline silicon semiconductor material suitable doped has heretofore been utilized as an electrode and as interconnection line material as it is compatible with the making of integrated circuit devices on silicon substrates. The resistivity of such a material even when heavily doped cannot normally be reduced below a certain minimum resistivity of about 0.001 ohm-cm. Thus, the usefulness of such a material for electrodes in interconnection lines in high density integrated circuits is limited. Refractory metals such as molybdenum have been used for first level electrodes and interconnection lines in integrated circuits as well as for the gate electrodes for the MOSFET devices thereof. While molybdenum has a suitably lower resistivity than doped polycrystalline silicon, its use in circuitry presents problems. Molybdenum is not protected or passivated by the molybdenum oxides that would be formed thereon in the various processing steps utilized in the fabrication of integrated circuits, as the oxides of molybdenum are highly volatile at the temperatures utilized. Also, some of the standard processing chemicals such as nitric acid and hydrogen peroxide which are utilized in processing the integrated circuits readily react with molybdenum. In connection with the use of molybdenum as a gate material for MOSFET devices, molybdenum even in thick layers does not prevent high energy ions used in the formation of source and drain regions in a self-aligning process from penetrating into the channel region of the device and altering the threshold voltage characteristics thereof. In addition, mobile ions can easily penetrate through the molybdenum layers or gates during subsequent high temperature processing and thereby alter the threshold voltage characteristics of the device.

The present invention is directed to the provision of structures and methods of making same which overcome the problems and difficulties heretofore experienced in utilization of molybdenum metallization in integrated circuits.

An object of the present invention is to provide an improved composite conductive structure for use in integrated circuits of high density and operating at high speeds.

Another object of the present invention is to provide composite structure of a conductor of molybdenum to which is bonded a smooth, physically strong film of molybdenum nitride.

Another object of the present invention is to provide a method of making composite conductive structures including a conductive element of molybdenum to the exposed surfaces of which is bonded a layer of molybdenum nitride.

A further object of the present invention is to provide a method of forming a film or coating of molybdenum nitride on a conductor which completely covers the exposed surfaces of the conductor, is easily controllable and is readily reproducible.

In carrying out the method of the present invention in accordance with one embodiment thereof, a substrate of semiconductor material having an overlying layer of an insulating material is provided. A conductor of molybdenum is formed in a desired pattern overlying the layer of insulating material. The substrate including the conductor of molybdenum is heated in an atmosphere including ammonia at a temperature in the range from about 400° C. to 850° C. for at time to cause the atmosphere to react with the conductor to convert at least a portion of the conductor of molybdenum into a layer of molybdenum nitride.

In accordance with another aspect of the present invention a composite conductive structure is formed including a substrate on which is provided a conductor of molybdenum covered with an adherent coating of molybdenum nitride formed by the process of reacting molybdenum with an atmosphere of ammonia in the temperature range from about 400° C. to about 850° C.

The novel features which are believed to be characteristic of the present invention are set forth with particularity in the appended claims. The invention itself, both as to its organization and method of operation together with further objects and advantages thereof, may best be understood by reference to the following description taken in connection with the accompanying drawings wherein:

Figure 1:
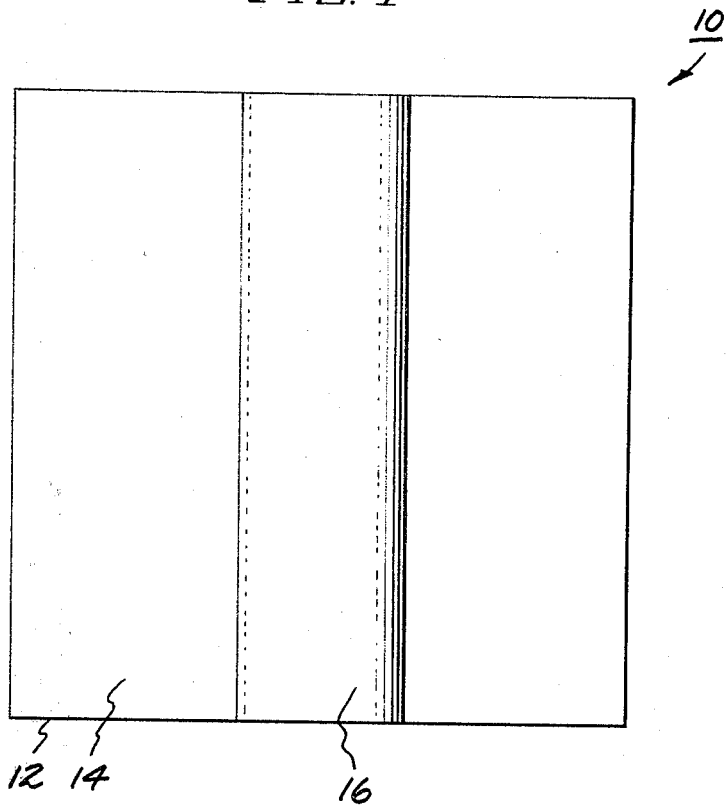
FIG. 1 is a plan view of a composite body including an insulating substrate on which is formed a first level of metallization of molybdenum covered by a layer of molybdenum nitride.

Referring now to FIG. 1 there is shown a composite body 10 illustrating a first level conductor 11 of molybdenum in accordance with the present invention. The composite body 10 includes a substrate 12 constituted of a substrate 13 of silicon semiconductor material on which a layer 14 of silicon dioxide has been formed. The layer 14 may represent either gate or field oxide of an integrated circuit, such as an imaging array, a memory array or a signal or a data processing circuit. Overlying the insulating layer 14 is a conductor 11 of molybdenum, for example, several thousand Angstroms thick. The conductor 11 may be formed by initially providing a layer of molybdenum on the surface of the insulating layer 12 to a suitable thickness, for example, several thousand Angstroms by sputtering and thereafter patterning the layer by photoresist masking and etching techniques well known in the art. Overlying the conductor 11 and completely covering the exposed portions thereof is provided a layer 16 of molybdenum nitride, which, for example, may be 1400 Angstroms thick bonded to the molybdenum conductor 11. The layer of molybdenum nitride is formed by reacting the patterned layer of molybdenum with ammonia at a temperature in the range of about 400° C. to 850° C. for a time to form the layer of molybdenum nitride of the desired thickness.

Figure 2:
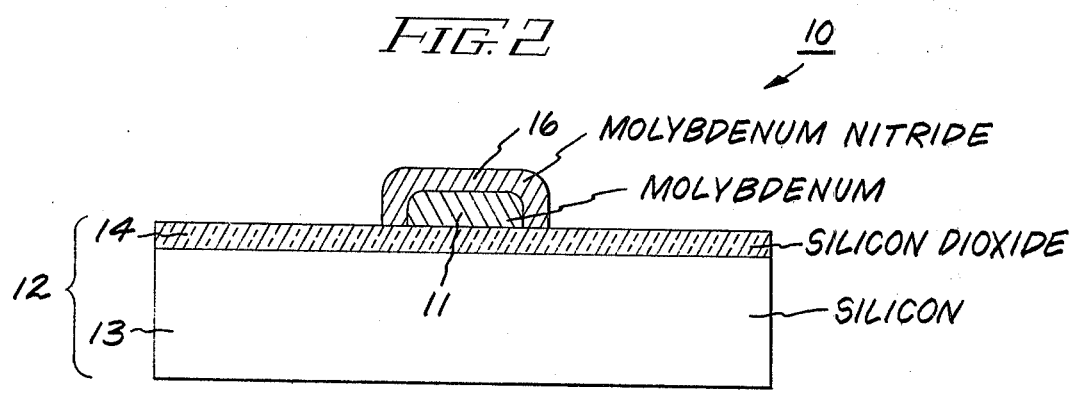
FIG. 2 is a cross-sectional view of the body of FIG. 1 taken along section lines 2—2 thereof.
Figure 3A:
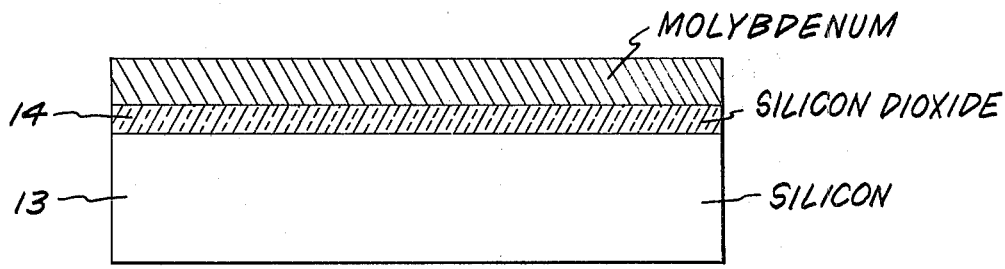
FIGS. 3A–3C show cross sections of structures representing successive steps in one method of fabricating the composite structure of FIG. 1 in accordance with the present invention.
Figure 3B:
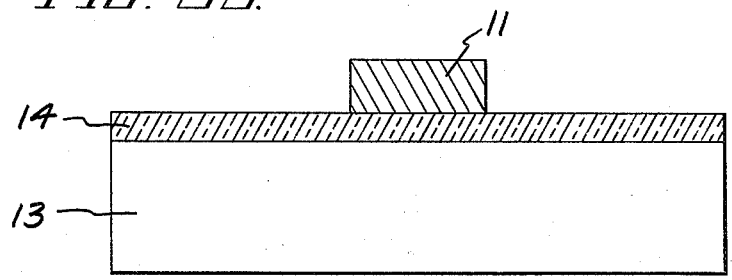
Figure 3C:
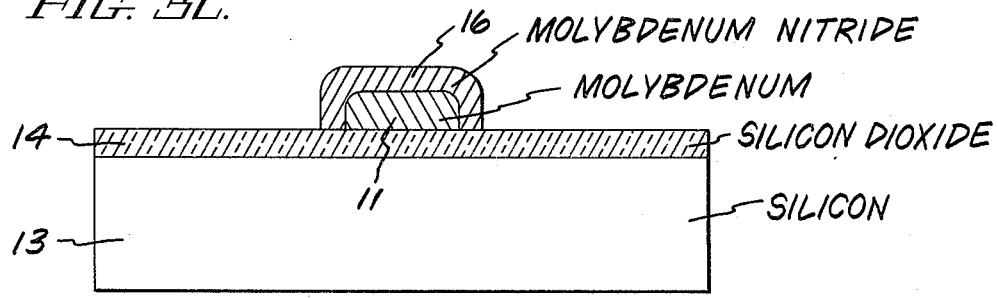

A method of fabricating the composite structure of FIGS. 1 and 2 will now be described in connection with FIGS. 3A–3C. The elements of FIGS. 3A–3C identical to the elements of FIGS. 1 and 2 are identically designated. A substrate of P-type silicon semiconductor material about 10 mils thick having a resistivity of 10 ohm-cm and having a major surface oriented parallel to the (100) plane of the crystal is provided. The substrate is cleaned and thereafter oxidized at 1000° C. in dry oxygen to grow 100 Angstroms of silicon dioxide thereon. The structure is then annealed in nitrogen at 1000° C. for 30 minutes to reduce oxide charge. A film or layer of molybdenum 3000 Angstroms thick is then sputtered in an argon atmosphere at reduced pressure on the layer of silicon dioxide. In this process the substrate is heated to about 250° C. to promote adhesion of the molybdenum to the layer of silicon dioxide. The layer of molybdenum is patterned using photolithographic masking and etching techniques well known in the art to provide a conductor 11, one micron wide, as shown in FIG. 3A. In the patterning of the layer of molybdenum a positive photoresist is utilized. The exposed portions of the molybdenum layer are etched in Pawn etch consisting of 15 parts of nitric acid, 30 parts of acetic acid, 38 parts of phosphoric acid and 75 parts of water by volume. Thereafter the resist is stripped in acetone and the molybdenum conductor is cleaned in hot phosphoric acid. The substrate is next placed in a horizontal open tube furnace in which a flow stream of ammonia and nitrogen in the ratio of 10% by volume of ammonia and the remainder nitrogen flowing at a rate of 2 liters per minute is established. The substrate is moved into a zone of the furnace in which a temperature of about 650° C. is provided. The substrate is exposed to the flow of ammonia and nitrogen in the furnace for a period of 10 minutes after which it is removed from the furnace. A layer of molybdenum nitride of about 1400 Angstroms thick is formed overlying and adherent to the unreacted portion of the molybdenum conductor completely covering the top and side surfaces thereof, as shown in FIG. 3C. The molybdenum nitride layer formed on the conductor of molybdenum is smooth, physically strong and has a high metallic luster. The sheet resistance of the composite layer of molybdenum and molybdenum nitride is 0.92 ohms per square.

The layer of molybdenum nitride has a composition given by the formula $Mo_2N$ and is a mixed phase consisting of crystallities of face centered cubic and face centered tetragonal cells. The layer of molybdenum nitride formed on the conductor of molybdenum reduces the passage of implantation and mobile ions therethrough, and also reduces the formation of oxides thereon and the erosion of the molybdenum from various chemical agents, such as nitric acid, hydrogen peroxide, utilized in fabrication of integrated structures utilizing molybdenum conductors.

When the temperature of the reaction is lowered the conversion of molybdenum into molybdenum nitride proceeds at a slower rate. When the reaction temperature is raised the converson of molybdenum into molybdenum nitride proceeds at a faster rate. Also, when the proportion of ammonia to nitrogen is reduced the reaction proceeds at a slower rate and when the proportion of ammonia to nitrogen is increased the reaction proceeds at a faster rate.

Reaction temperatures below about 400° C. produce significantly thinner layers of molybdenum nitride than at temperatures above 400° C. Reaction temperatures above about 750° C. produce a layer of molybdenum nitride including components having the composition of MoN as well as $Mo_2N$. The MoN component is constituted of crystallities of hexagonal cells. The layer of molybdenum nitride formed in the range from about 400° C. to 850° C. is smooth, has a metallic luster and is strongly adherent to the molybdenum conductor. At reaction temperatures above about 850° C. the layer of molybdenum nitride is constituted of MoN. The layer of molybdenum nitride formed is brittle, irregular in form, lacks metallic luster and has poor adhesion qualities.

While ammonia and nitrogen in the proportions of 10% ammonia and the remainder nitrogen by volume are utilized, other proportions of ammonia greater or less than 10% may be utilized. With a greater percentage of ammonia the formation of molybdenum nitride proceeds at a faster rate and with a smaller percentage of ammonia the formation of molybdenum nitride proceeds at a slower rate.

While in the example described above only a portion of the conductor of molybdenum is converted into molybdenum nitride, the conductor could have been completely converted to molybdenum nitride, if desired, by allowing the reaction to completely consume the molybdenum conductor by variation of one or several of the parameters of time, temperature and ammonia concentration in the reacting atmosphere.

While the ammonia was dilute with nitrogen other diluents may be utilized, for example, gases of the eighth column of the Periodic Table of Elements, such as argon, helium and neon.

While an open tube reactor was utilized, other types of reactors could be used for carrying out the process, for example, vertical radio frequency reactors.

While the layer 14 of insulating material on which the conductive member 11 of molybdenum was formed is silicon dioxide, it is apparent that the insulating layer may be constituted of any of a number of materials such as silicon nitride, or a layer of silicon nitride overlying a layer of silicon dioxide or combinations thereof. Also, while a silicon substrate has been shown as the material on which the insulating layer of silicon dioxide is formed, any of a number of semiconductor substrates may be utilized, for example, gallium arsenide.

While the conductive member 11 of molybdenum was formed on a layer 14 of insulating material, it is apparent that the conductive member of molybdenum may be formed on other materials, such as semiconductor materials, for example silicon, and such as conductive materials, for example platinum or titanium.

While the invention has been described in specific embodiments, it will be understood that modifications, such as those described above, may be made by those skilled in the art and it is intended by the appended claims to cover all such modifications and changes as fall within the true spirit and scope of the invention.

What we claim as new and desire to secure by Letters Patent of the United States is:

1. A method of forming a composite structure comprising:
   providing a substrate,
   patterning said layer of molybdenum to form a conductor by sputtering in a desired depositing a layer of molybdenum on said substrate,
   heating said substrate including said conductor of molybdenum in an atmosphere including ammonia at a temperature in the range from about 400° C. to 850° C. for a time to cause said atmosphere to react with said conductor to convert at least a portion of said conductor into a layer of molybdenum nitride.

2. The method of claim 1 in which said substrate including said conductor of molybdenum is heated in an atmosphere including ammonia at a temperature in the range from about 400° C. to 750° C. for a time to cause said atmosphere to react with said conductor of molybdenum to convert at least a portion of said conductor of molybdenum into a layer of molybdenum nitride having the composition $Mo_2N$.

3. The method of claim 1 in which said substrate including said conductor of molybdenum is heated in an atmosphere including ammonia at a temperature in the range from about 750° C. to 850° C. for a time to cause said atmosphere to react with said conductor of molybdenum to convert at least a portion of said conductor of molybdenum into a layer of molybdenum nitride including the constituents $Mo_2N$ and $MoN$.

4. The method of claim 1 in which said atmosphere consists of ammonia and a relatively inert carrier gas.

5. The method of claim 4 in which said relatively inert carrier gas is nitrogen.

6. The method of claim 4 in which said relatively inert carrier gas is a gas selected from the group consisting of argon, helium and neon.

7. The method of claim 1 in which the concentration of ammonia in said atmosphere is less than about 10% by volume with the remainder being nitrogen.

8. The method of claim 1 in which said substrate is constituted of an insulating material.

9. The method of claim 1 in which said substrate is constituted of a semiconductor material.

10. The method of claim 1 in which said substrate is constituted of a conductive material.

11. The method of claim 1 in which said substrate includes a layer of semiconductor material having an overlying layer of insulating material on which said conductor of molybdenum is formed.

12. The method of claim 11 in which said semiconductor material is silicon.

13. The method of claim 11 in which said insulating material is silicon dioxide.

14. The method of claim 11 in which said insulating material is constituted of a layer of silicon nitride overlying a layer of silicon dioxide.

15. The method of claim 11 in which said insulating material is a composite of silicon dioxide and silicon nitride.

16. The method of claim 1 in which said layer of molybdenum is deposited by sputtering molybdenum on said substrate.

17. In combination,
  a substrate,
  a patterned conductive layer of molybdenum overlying said substrate, said conductor being formed by sputtering molybdenum on said substrate,
  a layer of molybdenum nitride overlying the exposed surfaces of said conductor, said layer of molybdenum nitride being formed by heating said conductor in an atmosphere including ammonia at a temperature in the range from about 400° C. to 850° C. for a time to cause said atmosphere to react with said conductor to form said layer of molybdenum nitride.

18. The combination of claim 17 in which said substrate is an insulating layer.

19. The combination of claim 18 in which said insulating material is silicon dioxide.

20. The combination of claim 17 in which said substrate is a semiconductor.

21. The combination of claim 20 in which said substrate is silicon.

22. The combination of claim 17 in which said substrate is constituted of a conductive material.

23. The combination of claim 22 in which said conductive material is platinum.

24. The combination of claim 22 in which said conductive material is titanium.

* * * * *